(12) United States Patent
Ryou et al.

(10) Patent No.: US 10,811,193 B2
(45) Date of Patent: Oct. 20, 2020

(54) CAPACITOR COMPONENT

(71) Applicant: SAMSUNG ELECTRO-MECHANICS CO., LTD., Suwon-Si, Gyeonggi-Do (KR)

(72) Inventors: Jeong Hoon Ryou, Suwon-si (KR); Hyun Ho Shin, Suwon-si (KR); Byeong Cheol Moon, Suwon-si (KR); Chang Soo Jang, Suwon-si (KR); Tae Joon Park, Suwon-si (KR); Yun Hee Kim, Suwon-si (KR); Kyo Yeol Lee, Suwon-si (KR); Seung Mo Lim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 217 days.

(21) Appl. No.: 15/961,445

(22) Filed: Apr. 24, 2018

(65) Prior Publication Data
US 2019/0088419 A1    Mar. 21, 2019

(30) Foreign Application Priority Data
Sep. 21, 2017    (KR) .................. 10-2017-0121757

(51) Int. Cl.
*H01G 4/30* (2006.01)
*H01G 4/008* (2006.01)
*H01G 4/33* (2006.01)
*H01G 4/012* (2006.01)
*H01L 49/02* (2006.01)

(52) U.S. Cl.
CPC ............. *H01G 4/306* (2013.01); *H01G 4/008* (2013.01); *H01G 4/012* (2013.01); *H01G 4/33* (2013.01); *H01L 28/87* (2013.01); *H01L 28/88* (2013.01); *H01L 28/91* (2013.01); *H01L 28/92* (2013.01)

(58) Field of Classification Search
CPC ........... H01G 4/30; H01G 4/306; H01G 4/228
See application file for complete search history.

(56) References Cited

U.S. PATENT DOCUMENTS

| | | | | |
|---|---|---|---|---|
| 6,980,413 | B1 * | 12/2005 | Kim | H01G 4/012 29/25.42 |
| 8,912,522 | B2 | 12/2014 | Rubloff et al. | |
| 2011/0073827 | A1 * | 3/2011 | Rubloff | B82Y 10/00 257/3 |
| 2014/0092524 | A1 * | 4/2014 | Kim | H01G 4/01 361/305 |

* cited by examiner

*Primary Examiner* — Eric W Thomas
(74) *Attorney, Agent, or Firm* — Morgan, Lewis & Bockius LLP

(57) ABSTRACT

A capacitor component includes a porous body, a first electrode layer covering surfaces of pores of the porous body, a dielectric layer covering the first electrode layer, and a second electrode layer filling the pores of the porous body and covering the dielectric layer.

23 Claims, 12 Drawing Sheets

CAPACITOR COMPONENT

CROSS-REFERENCE TO RELATED APPLICATION(S)

This application claims benefit of priority to Korean Patent Application No. 10-2017-0121757 filed on Sep. 21, 2017 in the Korean Intellectual Property Office, the disclosure of which is incorporated herein by reference in its entirety.

TECHNICAL FIELD

The present disclosure relates to a capacitor component.

BACKGROUND

A capacitor may be mounted on the printed circuit boards of various types of electronic products, such as image devices including a liquid crystal display (LCD) and a plasma display panel (PDP), a computer, a smartphone, a mobile phone, and the like, serving to charge or discharge electricity. In recent years, as portable IT products such as smartphones and wearable devices are being thinned, there has been a growing need for thinner passive components to reduce overall package thickness.

In accordance with this tendency, demand for a thin film capacitor capable of realizing a reduced thickness is increasing, and a thin film capacitor may be realized by using a thin film technology. In addition, such a thin film capacitor has an advantage of having a low ESL, unlike existing multi-layer ceramic capacitors. As a result, the application of the thin film capacitor to a decoupling capacitor for an application processor (AP) has been recently researched. To apply the thin film capacitor to the decoupling capacitor for the AP, the thin film capacitor has been manufactured in a form of a land-side capacitor (LSC).

Meanwhile, a trench type capacitor has been developed to increase a capacity of the capacitor in a limited space, which is a method of forming a capacitor structure after forming a trench in a silicon substrate. The trench type capacitor is suitable for increasing capacity by increasing a surface area of an electrode layer. However, such a trench type capacitor not only requires a complicated semiconductor processing technique, but it is also difficult to form a plurality of dielectrics in such a trench when considering a dielectric thickness satisfying a withstand voltage condition. As a result, it may be hard to realize a trench type capacitor having ultrahigh capacity.

SUMMARY

An aspect of the present disclosure may provide a capacitor component capable of realizing an ultrahigh capacity by increasing a surface area of an electrode layer and a dielectric layer and being efficiently manufactured by minimizing the number of semiconductor processes.

According to an aspect of the present disclosure, a capacitor component may include: a porous body; a first electrode layer covering surfaces of pores of the porous body; a dielectric layer covering the first electrode layer; and a second electrode layer filling the pores of the porous body and covering the dielectric layer.

The pores of the porous body may penetrate through the porous body.

The pores of the porous body may have a cylindrical shape.

The pores of the porous body may be arranged in an array.

The capacitor component may further include: a first common electrode layer connected to an exposed region of the first electrode layer exposed by the dielectric layer.

The capacitor component may further include: an insulating layer formed between the first common electrode layer and the second electrode layer.

The first electrode layer may cover the entire surface of the pores of the porous body.

The capacitor component may further include: a metal layer connected to an exposed region of the porous body exposed by the first electrode layer.

The metal layer may be in contact with one surface of upper and lower surfaces of the porous body and a side surface thereof.

The porous body may be an anodic oxidant which is a material forming the metal layer.

The first electrode layer and the dielectric layer may extend to a region between the metal layer and the second electrode layer.

Unevenness may be formed in a region corresponding to the region, in which the first electrode layer and the dielectric layer extend, in the metal layer and the first electrode layer and the dielectric layer are formed along the unevenness of the metal layer.

The capacitor component may include a plurality of stack units stacking on each other, each stack unit including the porous body, the first electrode layer, the dielectric layer, the second electrode layer, and the metal layer.

Each stack unit may further include an insulating layer covering one side surface of the metal layer.

The insulating layer of one of the plurality of stack units may be disposed in a position opposite to an insulating layer of another stack unit adjacent to the one stack unit.

The capacitor component may further include: first and second external electrodes covering side surfaces of the plurality of stack units.

The second electrode layer may include a conductive polymer.

The second electrode layer may be a plating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
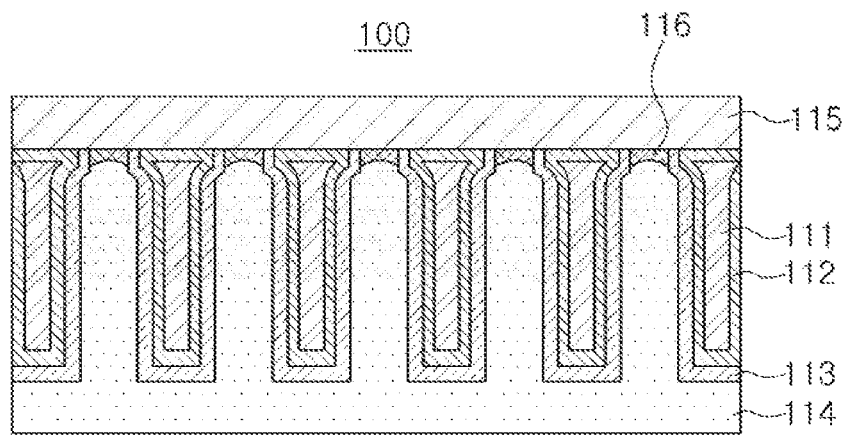
FIG. 1 is a cross-sectional view schematically illustrating a capacitor component according to an exemplary embodiment in the present disclosure.

FIG. 1 is a cross-sectional view schematically illustrating a capacitor component according to an exemplary embodiment in the present disclosure. FIGS. 2 through 11 are diagrams illustrating an example of a method for manufacturing a capacitor component of FIG. 1.

Referring to FIG. 1, a capacitor component 100 according to an exemplary embodiment in the present disclosure may have a structure including a porous body 111, a first electrode layer 112, a dielectric layer 113, and a second electrode layer 114, and may further include a first common electrode layer 115 on the first electrode layer 112 to be connected thereto. In this case, an insulating layer 116 may be disposed between the first common electrode layer 115 and the second electrode layer 114 to electrically isolate the first common electrode layer 115 and the second electrode layer 114 from each other.

Figure 6A:
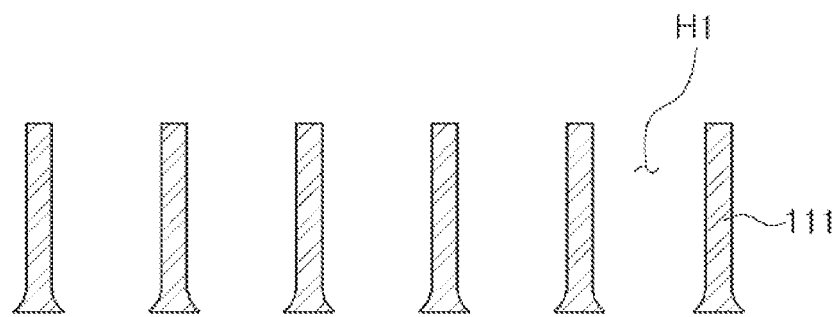
Figure 6B:
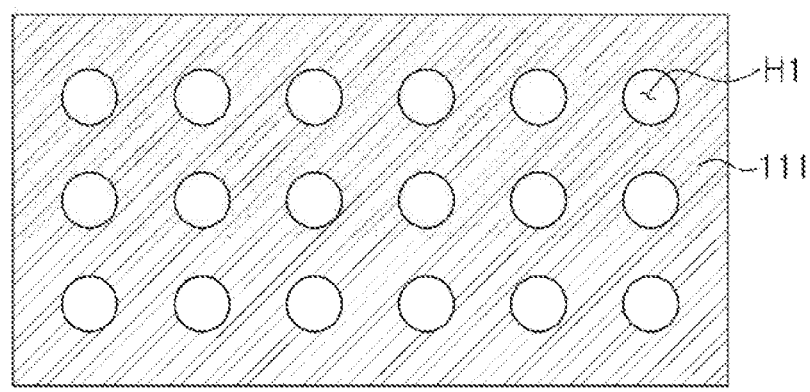

The porous body 111 includes pores to have a large surface area. In this case, the pores may be formed to penetrate through the porous body 111 in a thickness direction. A thickness of an upper portion of a wall of the porous body 111 between two adjacent pores may be less than a thickness of a lower portion of the wall of the porous body 111 between the two adjacent pores. For example, the pores may have a cylindrical shape. The pores of the porous body 111 may be arranged in an array, and a concrete example of this shape may refer to a shape of a pore H1 shown in FIGS. 6A and 6B (FIG. 6A is a cross-sectional view and FIG. 6B is a plan view).

In the case of the present embodiment, the porous body 111 may be an anodic oxidant obtained by anodizing metal. In the case of valve metal such as aluminum (Al), zirconium (Zr), titanium (Ti), and tungsten (W), if a voltage is applied in an electrolyte, ion migration may occur at an interface between the metal and the electrolyte, such that an anodized layer may be formed on a metal surface. In the anodizing process, a large number of pores are formed on the oxide layer, thereby greatly increasing a surface area. In this anodizing process, a size, a density, and the like of the pores may be adjusted by appropriately setting process conditions such as the electrolyte and the applied voltage in the anodizing process, and the pores may be deepened as the oxidation continuously occurs. From this, a porous body 111 having pores of about several tens to several hundreds of nm in diameter may be realized.

The first electrode layer 112 may cover the surface of the pores of the porous body 111 and configure a part of an electrode portion of the capacitor. The first electrode layer 112 may be formed of metal having excellent electrical conductivity such as Ag, Cu, Pt, and Ni, and may be effectively formed on the surface of the pores which are a micro pore form by using a process such as an atomic layer deposition (ALD). In this case, as shown in FIG. 1, the first electrode layer 112 may have a form to cover the entire surface of the pores of the porous body 111.

The dielectric layer 113 may have a form to cover the first electrode layer 112 and may be formed of a material such as alumina ($Al_2O_3$), $SiO_2$, $Sn_3N_4$, $ZrO_2$, $CaTiO_3$, $SrTiO_3$, (Ba, Sr) $TiO_3$, and $BaTiO_3$. In this case, the dielectric layer 113 may be formed of a plurality of materials to increase insulating property. In the present embodiment, as shown in FIG. 1, a portion of the first electrode layer 112 may be exposed without being covered by the dielectric layer 113, and the first electrode layer 112 may be disposed to be connected to the first common electrode layer 115 through the exposed region of the first electrode layer 112.

The second electrode layer 114 may be filling the pores of the porous body 111 while covering the dielectric layer 113. The second electrode layer 114 may configure an electrode portion of the capacitor portion and may be filling the pores to have a large surface area, thereby increasing the capacity of the capacitor component 100. In the case of the present embodiment, the second electrode layer 114 may include a conductive polymer. The conductive polymer may be realized, for example, by dispersing conductive particles in a polymer. When the second electrode layer 114 is formed using the conductive polymer, the conductive polymer may be applied to the pores of the porous body 111 in a state having fluidity. In this case, the conductive polymer may be effectively filling the micro pores of the porous body 111 by a capillary effect. When the second electrode layer 114 is formed by the atomic layer deposition using a material such as metal, the process time is long and the second electrode layer 114 may not be effectively formed in the micro pores. In the present embodiment, the second electrode layer 114 may be formed in such a manner that the conductive polymer penetrates into the micro pores to increase the filling effect of the electrode layer 114, thereby securing the sufficient electric capacity. In addition, as described above, when the pores have a shape penetrating through the porous body 111, the second electrode layer 114 may be more easily formed and the non-filled region may be reduced. However, as a method for effectively filling micro pores, methods other than using a conductive polymer may be used. For example, a plating process may be used. In this case, the second electrode layer 113 may be a plating layer including a material such as Cu.

The first common electrode layer 115 may be connected to the first electrode layer 112 and may be formed by applying a conductive paste including, for example, metal. The insulating layer 116 disposed between the first common electrode layer 115 and the second electrode layer 114 may be formed of a material such as $SiO_2$, $TiO_2$, and $Al_2O_3$.

Hereinafter, an example of a process for manufacturing a capacitor component having the structure described above will be described with reference to FIGS. 2 through 11. The structural features of the capacitor components may be more clearly understood from the description of the manufacturing process to be described later.

Figure 2:
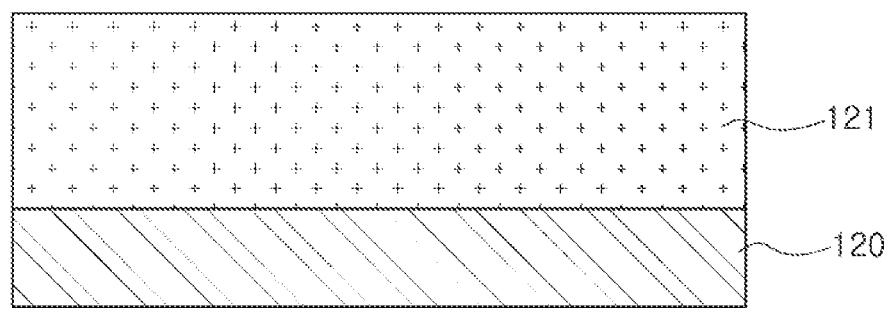
FIGS. 2 through 11 are diagrams illustrating an example of a method for manufacturing a capacitor component of FIG. 1.

First, as shown in FIG. 2, a metal layer 121 is formed on an anode substrate 120, which forms the anode of the anodizing process. The metal layer 121 may be made of, for example, aluminum (Al), zirconium (Zr), titanium (Ti), and tungsten (W) as the valve metal suitable for the anodizing process. However, the metal layer 121 itself may be used as the anode. In this case, the anode substrate 120 is not required.

Figure 3:
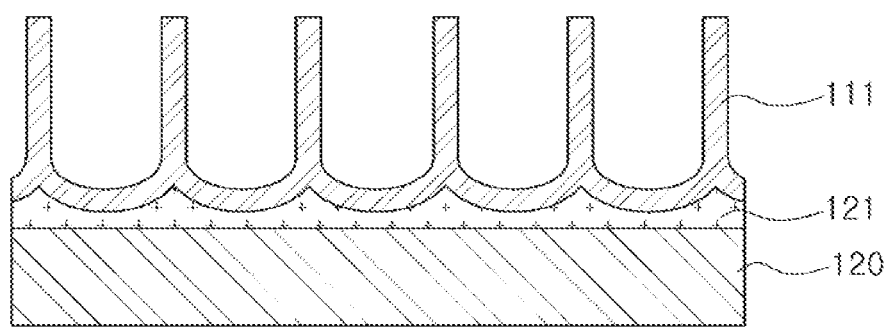
Figure 4:
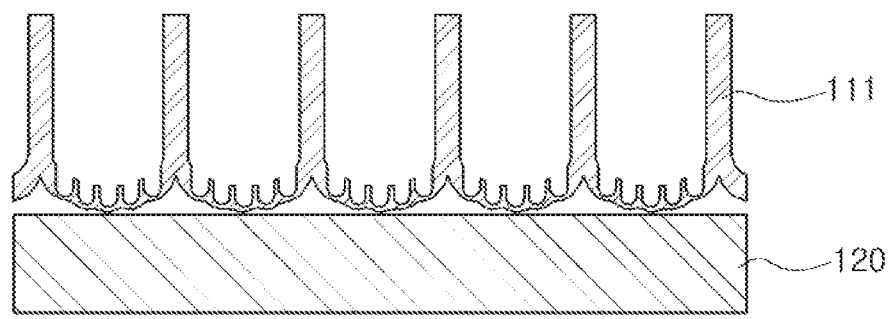
Figure 5:
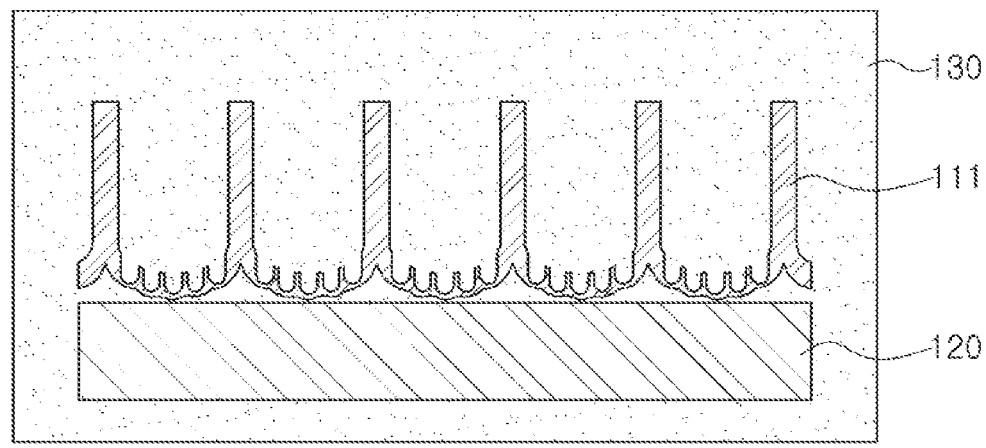

Next, as shown in FIG. 3, the porous body 111 is formed using the anodizing process, and the porous body 111 is formed of a metal oxide layer. As the anodizing process proceeds, the pores of the porous body 111 may be expanded and formed deeply. In the finishing step of the anodizing process, the applied voltage is lowered. In this case, as shown in FIG. 4, a plurality of micropores may be formed on a bottom surface of the porous body 111. After the anodizing process, as shown in FIG. 5, the porous body 111 is immersed in an acidic solution 130, for example, a phosphoric acid solution to further expand the pores and etch the plurality of micropores. The porous body 111 having a plurality of pores H1 as shown in FIG. 6 may be formed by the series of processes. After the porous body 111 is obtained, the anode substrate 120 may be separated from the porous body 111. However, the above-described anodizing process is only one example for forming the porous body 111, and the method of forming pores may be replaced by other suitable processes.

Figure 7:
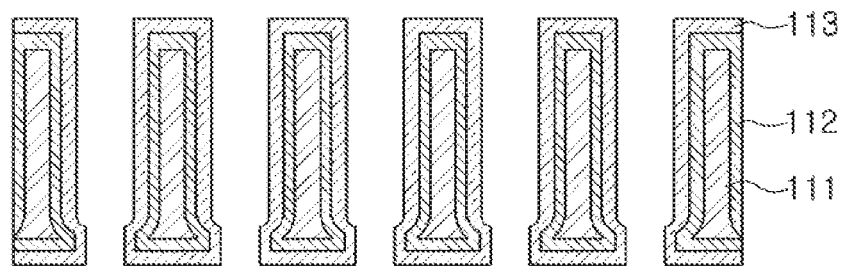

Next, as shown in FIG. 7, the first electrode layer 112 and the dielectric layer 113 may be sequentially formed on the surface of the porous body 111, specifically, on the surface of the pores. This process may be effectively performed using the atomic layer deposition as described above. However, the atomic layer deposition is not necessarily used, and therefore other deposition processes may be used as needed.

Figure 8:
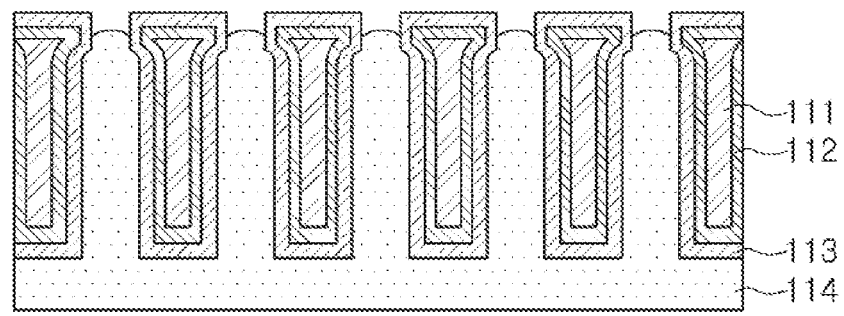

Next, as shown in FIG. 8, the second electrode layer 114 having the form of filling the pores of the porous body 111 is formed. The second electrode layer 114 may include the conductive polymer, and when the second electrode layer 114 is applied to the porous body 111 in the state having fluidity, the second electrode layer 114 may be filling the micropores by the capillary effect. In this case, the conductive polymer having fluidity may be effectively penetrated through pores which are open above and under the porous body 111. However, as described above, the second electrode layer 114 may be formed using the plating process other than the method using a conductive polymer.

Figure 9:
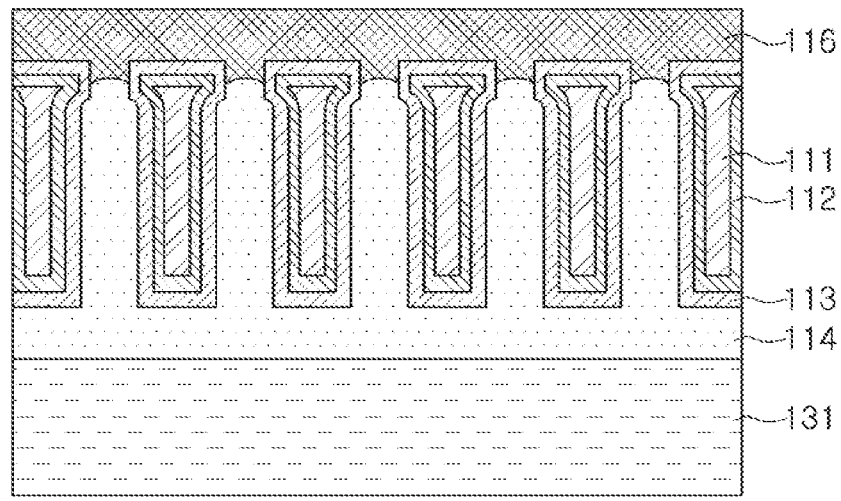
Figure 10:
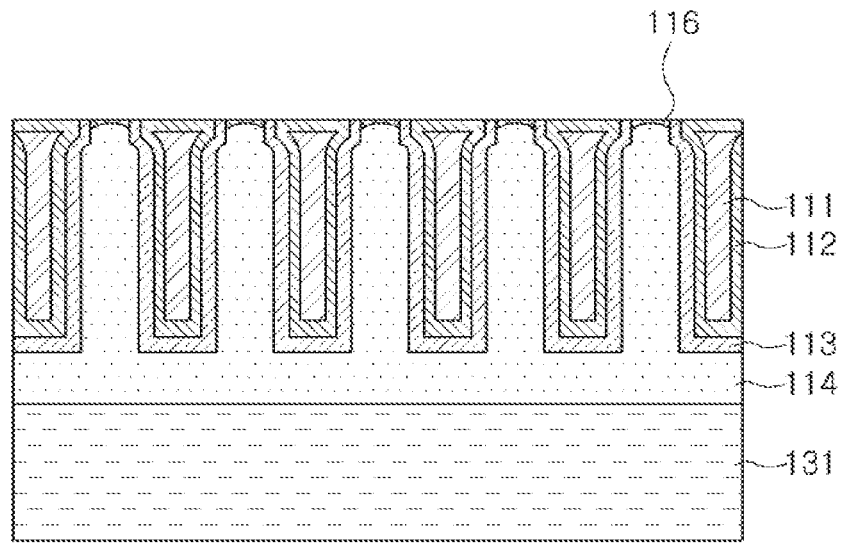
Figure 11:
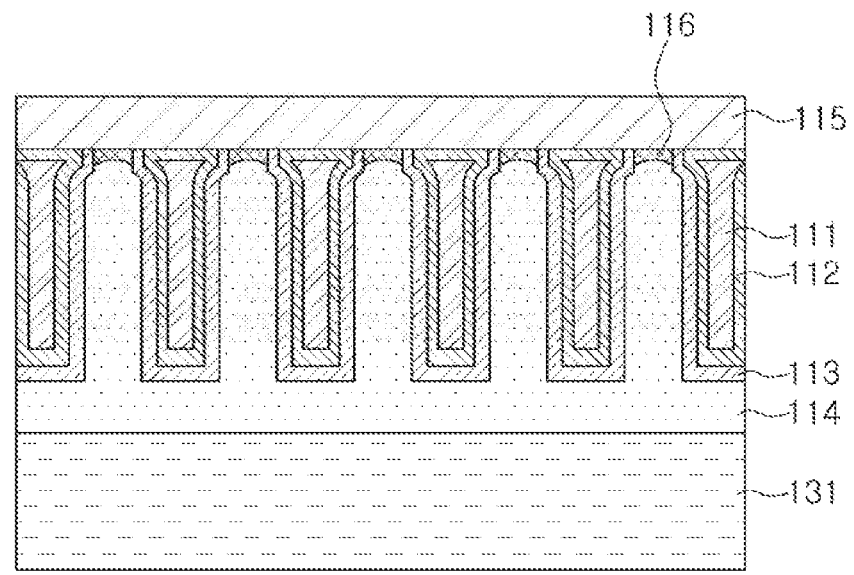

Next, as shown in FIG. 9, the insulating layer 116 may be formed to close the pores of the porous body 111, and may be formed by depositing or applying $SiO_2$ or the like. In this case, in order to more easily handle the porous body 111, a carrier 131 may be attached under the second electrode layer 114. Next, an upper end of the insulating layer 116 is etched to expose the first electrode layer 112, which is the same as that shown in FIG. 10. Next, as shown in FIG. 11, the first common electrode layer 115 may be formed on the porous body 111 to be connected to the first electrode layer 112. The first common electrode layer 115 may be obtained by applying the conductive paste and curing the conductive paste. Next, the carrier 131 may be removed to obtain the capacitor component 100 having the form shown in FIG. 1.

Figure 12:
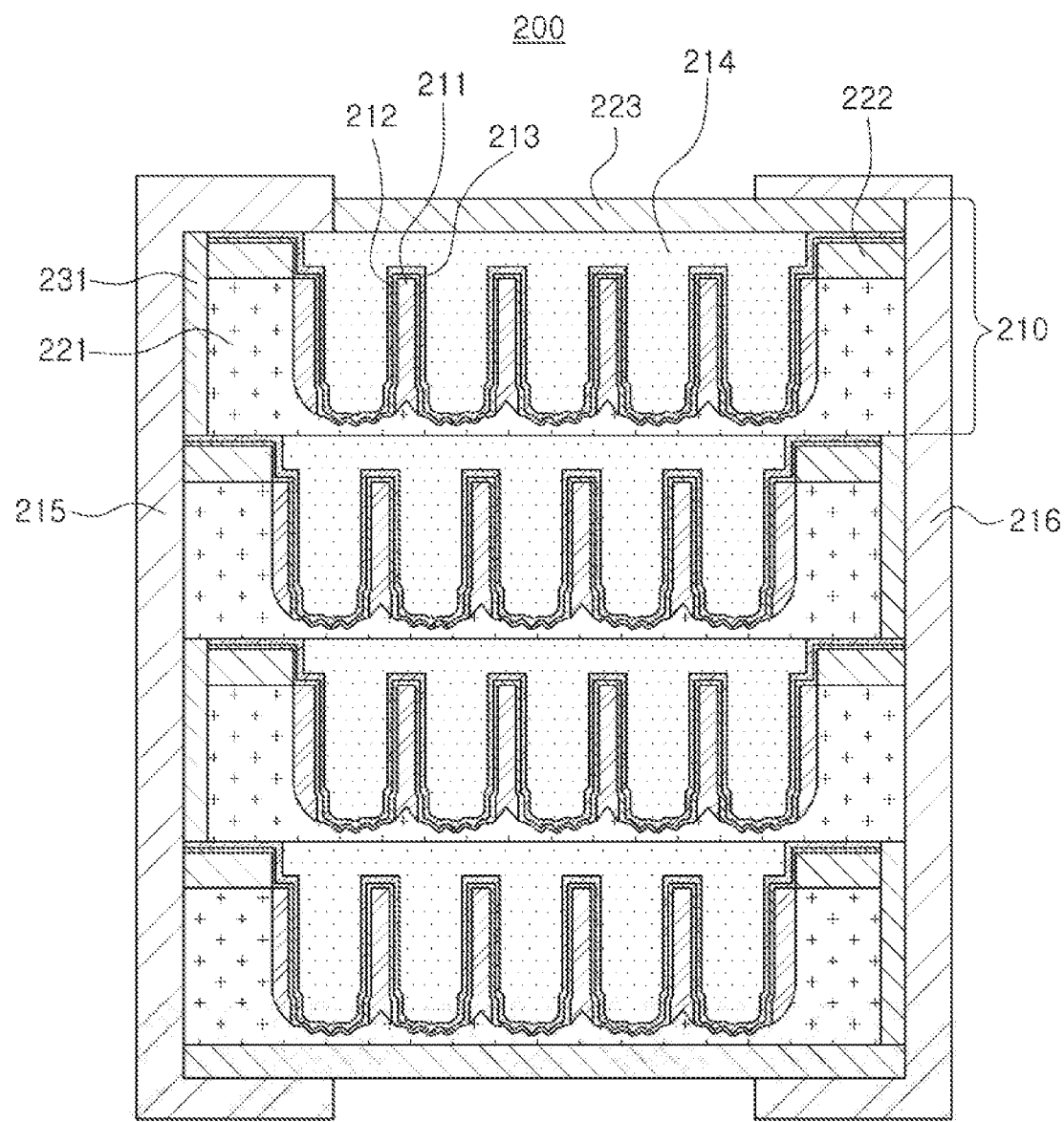
FIG. 12 is a cross-sectional view schematically illustrating a capacitor component according to another exemplary embodiment in the present disclosure.

FIG. 12 is a cross-sectional view schematically illustrating a capacitor component according to another exemplary embodiment in the present disclosure. FIGS. 13 through 21 are diagrams illustrating an example of a method for manufacturing a capacitor component of FIG. 12.

Referring to FIG. 12, a capacitor component 200 according to an exemplary embodiment in the present disclosure may have a structure including a porous body 211, a first electrode layer 212, a dielectric layer 213, a second electrode layer 214, and a metal layer 221, and have a form in which the porous body 211, the first electrode layer 212, the dielectric layer 213, the second electrode layer 214, and the metal layer 221 are stacked in a plurality of stack units 210 as one stack unit 210. The insulating layer 222 may be formed on an upper surface of the metal layer 221 in each of the stack units 210, and the insulating layer 223 may be disposed even on a top and a bottom of the stack units 210. As described above, according to the present embodiment, it is possible to effectively secure higher capacity by the structure in which a plurality of porous capacitors are stacked.

A thickness of an upper portion of a wall of the porous body 211 between two adjacent pores may be less than a thickness of a lower portion of the wall of the porous body 211 between the two adjacent pores. Unlike the exemplary embodiment described above, a part of the porous body 211 may be exposed without being covered by the first electrode layer 212 and the metal layer 221 may be connected to the exposed region of the porous body 211. Specifically, the metal layer 221 may be in contact with one of the upper and lower surfaces of the porous body 211 and a side surface thereof. This form may be obtained by anodizing a part of the metal layer 221. In other words, the porous body 211 may be an anodic oxidant of a material forming the metal layer 221 corresponding to the valve metal, and the metal layer 221 may be a region remaining without being anodized. As in the present embodiment, when a part of the metal layer 221 is not anodized, the metal layer 221 may be utilized as the electrode layer.

The shapes of the first electrode layer 212 and the dielectric layer 213 may be partially changed in that the metal layer 221 remains separately from the porous body 211. As illustrated in FIG. 12, the first electrode layer 212 and the dielectric layer 213 may extend to a region into which the second electrode layer 214 penetrates, that is, a region between the metal layer 221 and the second electrode layer 214. In this case, unevenness may be formed in a region corresponding to the region, where the first electrode layer 212 and the dielectric layer 213 extend, in the metal layer 221, which may be formed during the process of lowering the magnitude in the applied voltage during the anodizing process described above. The first electrode layer 212 and the dielectric layer 213 may be formed along the unevenness of the metal layer 221 to further increase the surface area.

The first and second external electrodes 215 and 216 may cover the side surfaces of the plurality of stack units 210 and may be electrically connected to the first electrode layer 212, the second electrode layer 214, and the metal layer 221 of each of the stack units 210. The stack unit 210 may include an insulating layer 231 covering one side surface of the metal layer 221. In this case, as shown in FIG. 12, the insulating layer 222 of each of the stack units 210 may be disposed at a position opposite to the insulating layer 222 of another adjacent stack unit 210, such that a connection method of the metal layer 221 and the external electrodes 215 and 216 may be appropriately adjusted.

Hereinafter, an example of a process for manufacturing a capacitor component having the structure of FIG. 12 will be described with reference to FIGS. 13 through 21. The structural features of the capacitor components may be more clearly understood from the description of the manufacturing process to be described later.

Figure 13:
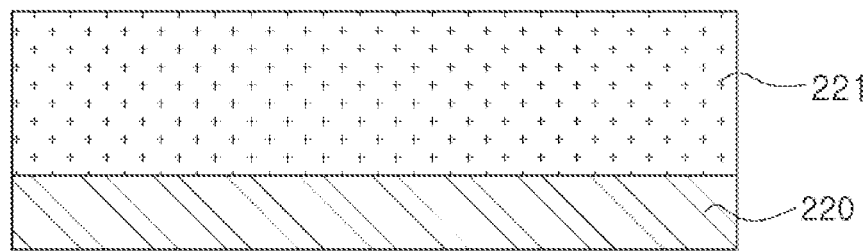
FIGS. 13 through 21 are diagrams illustrating an example of a method for manufacturing a capacitor component of FIG. 12.

First, as shown in FIG. 13, the metal layer 221 is formed on an anode substrate 220, which forms the anode of the anodizing process. The metal layer 221 may be made of, for example, aluminum (Al), zirconium (Zr), titanium (Ti), and tungsten (W) as the valve metal suitable for the anodizing process. However, the metal layer 221 itself may be used as the anode. In this case, the anode substrate 220 is not required.

Figure 14A:
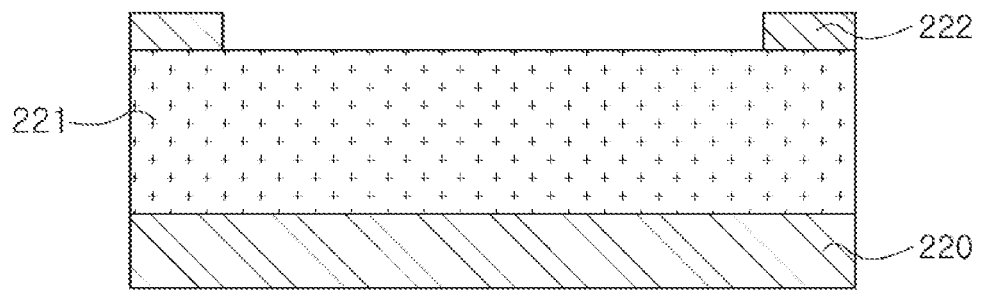
Figure 14B:
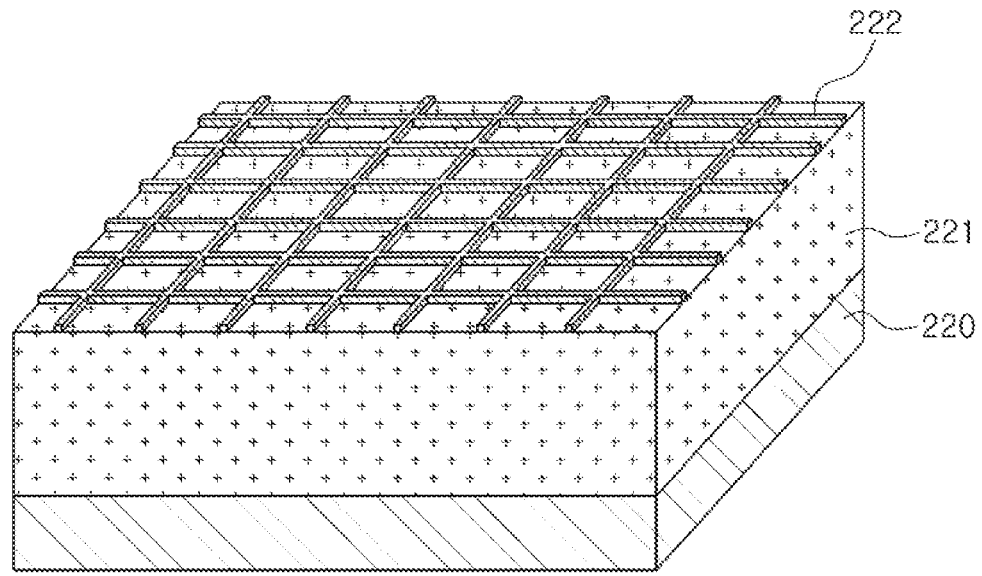

Next, as shown in FIGS. 14A and 14B (FIG. 14A is a sectional view and FIG. 14B is a perspective view), an insulating layer 222 in a pattern form may be formed on the metal layer 221, and may be diced in units of each device along a patterned line during subsequent processes. However, the steps of FIG. 14 may be omitted in some cases.

Figure 15:
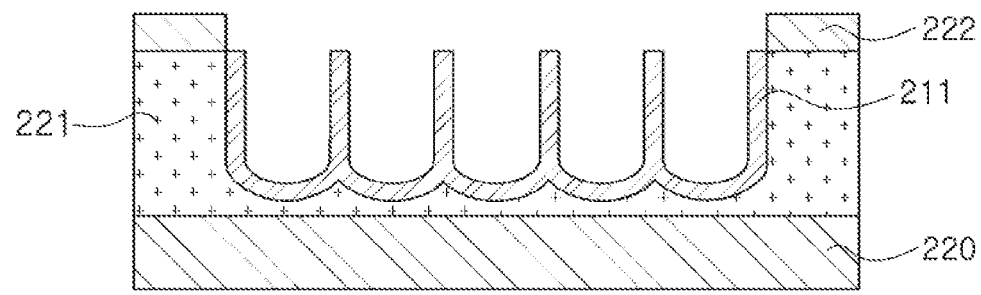
Figure 16:
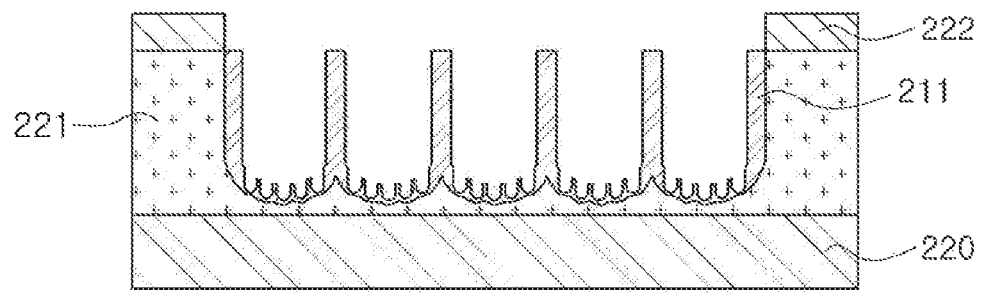
Figure 17:
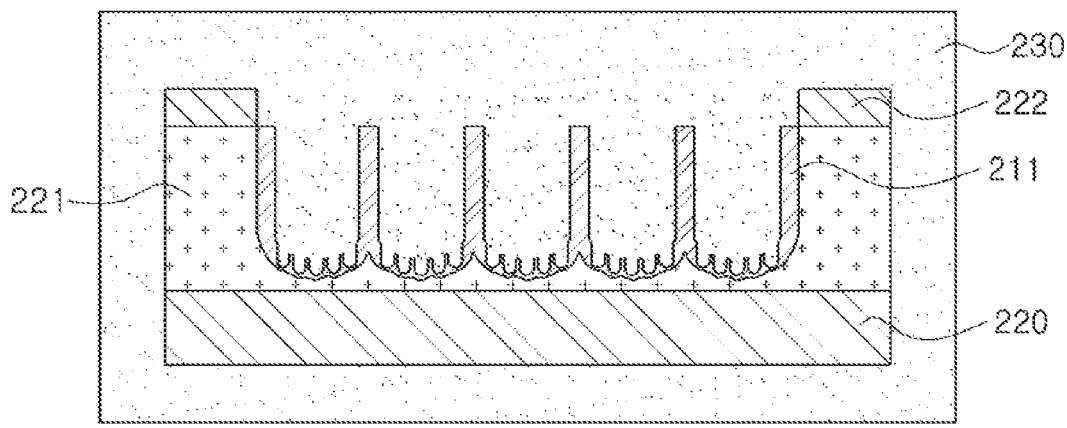
Figure 18:
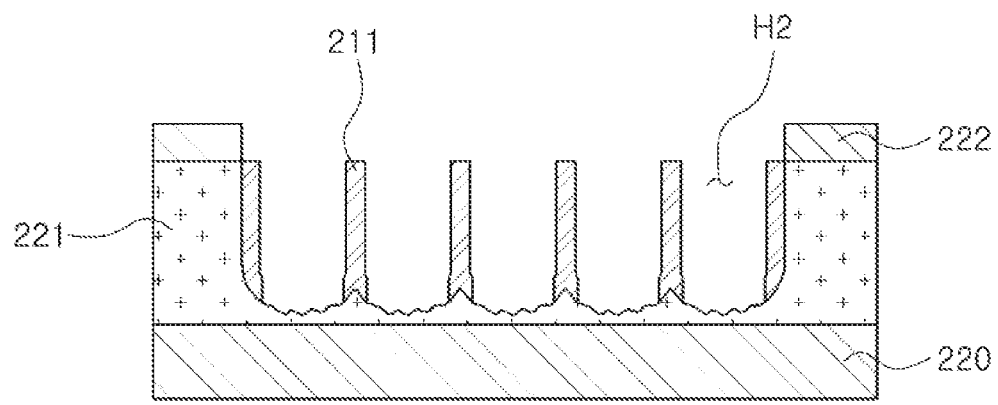

Next, as shown in FIG. 15, the porous body 211 is formed using the anodizing process, and the porous body 211 is formed of a metal oxide layer. As the anodizing process proceeds, the pores of the porous body 211 may be expanded and formed deeply. In the finishing step of the anodizing process, the applied voltage is lowered. In this case, as shown in FIG. 16, a plurality of micropores may be formed on the bottom surface of the porous body 211. After the anodizing process, as shown in FIG. 17, the porous body 211 is immersed in the acidic solution 230 to further expand the pores and etch the plurality of micropores. The porous body 211 having a plurality of pores H2 as shown in FIG. 18 may be formed by the series of processes. In this process, the surface of the metal layer 221 may be exposed. In this case, unevenness may remain on the surface of the metal layer 221. In addition, since the metal layer 221 remains, the pores H2 of the porous body 211 may be implemented in a closed form in a lower direction.

Figure 19:
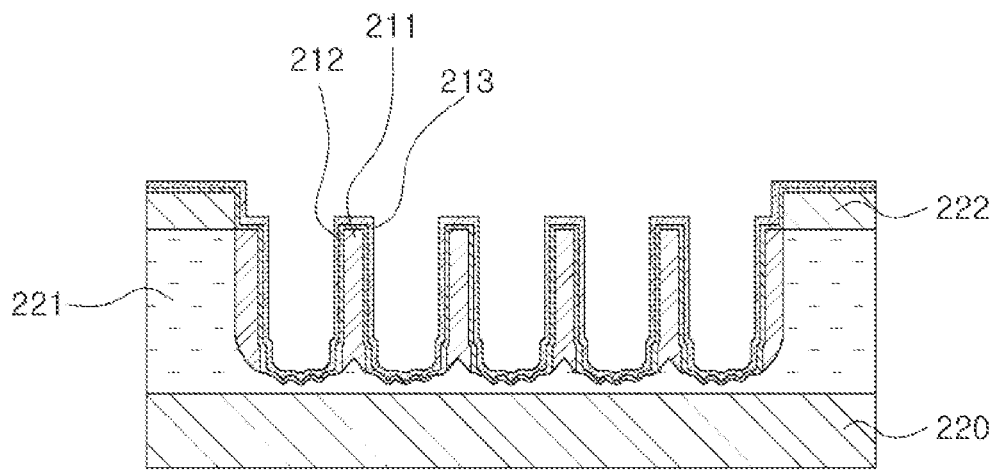

Next, as shown in FIG. 19, the first electrode layer 212 and the dielectric layer 213 may be sequentially formed on the surface of the porous body 111, specifically, on the surface of the pores and the surface of the metal layer 221. This process may be effectively performed using the atomic layer deposition as described above. However, the atomic layer deposition is not necessarily used, and therefore other deposition processes may be used as needed.

Figure 20:
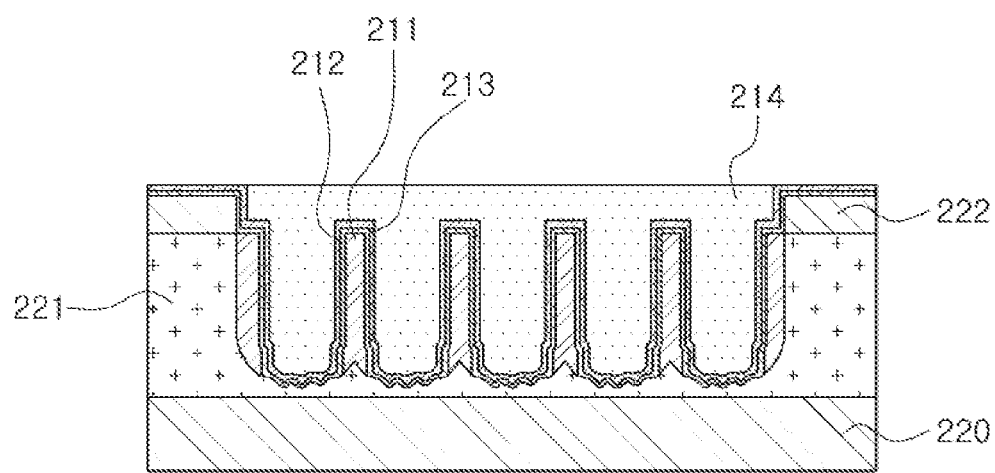

Next, as shown in FIG. 20, the second electrode layer 214 having the form of filling the pores of the porous body 211 is formed. The second electrode layer 214 may include the conductive polymer, and when the second electrode layer 214 is applied to the porous body 211 in the state having fluidity, the second electrode layer 214 may be filling the micropores by the capillary effect. However, as described above, the second electrode layer 214 may be formed using the plating process other than the method using a conductive polymer.

Figure 21:
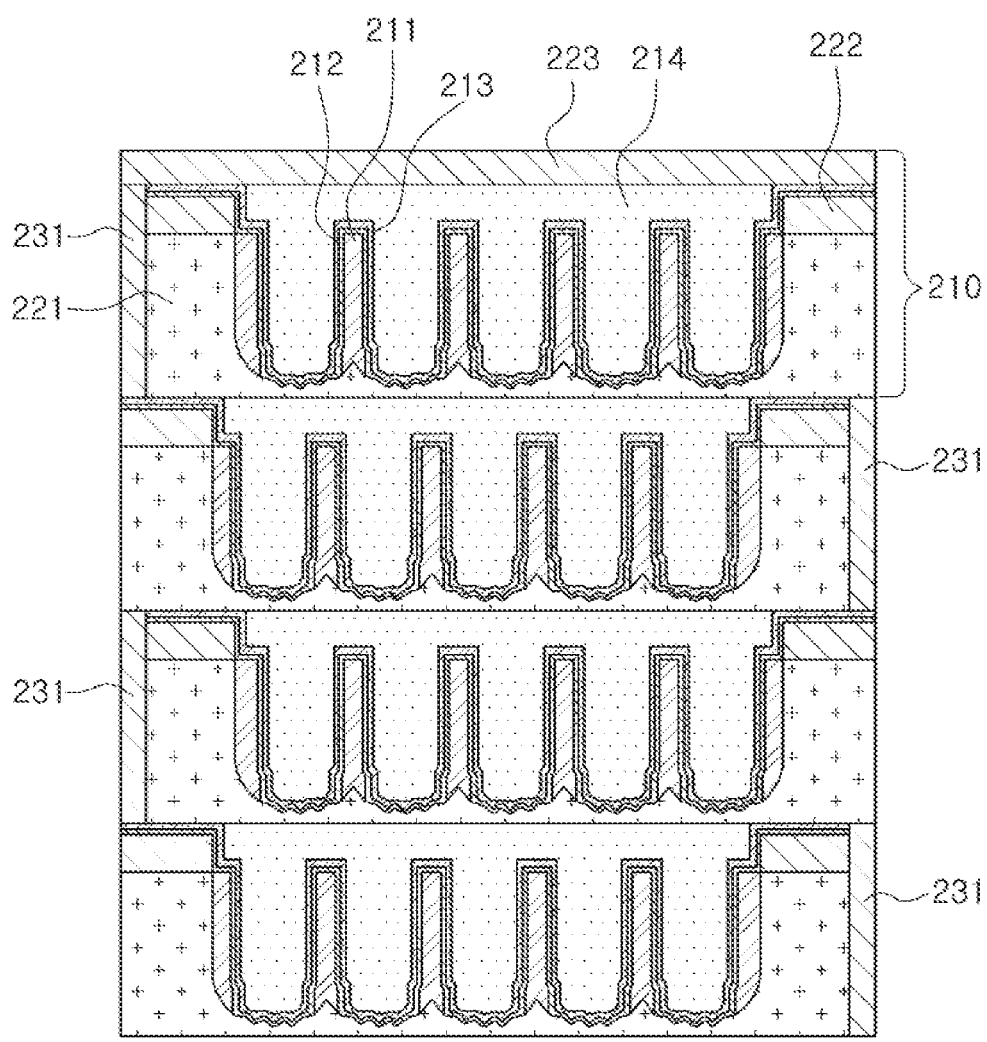

Next, an insulating layer 231 is formed on one of the cut surfaces of the metal layer 221 by being cut along the insulating layer 222 having the pattern form in units of device. Thereafter, a laminate as shown in FIG. 21 may be obtained by stacking the unit device, that is, the above-described stack unit 210 so that the positions of the insulating layer 231 cross each other. In this case, when the stack unit 210 is stacked, the cut surfaces of the metal layer 221 may be used for alignment. Thereafter, the external electrodes 215 and 216 may be formed on the surface of the stack structure of the plurality of stack units 210 to obtain the capacitor component 200 shown in FIG. 12. The external electrodes 215 and 216 may be formed by performing at least one of the processes such as the applying process of the conductive paste, the applying process of the conductive polymer, and the plating process.

As set forth above, according to the exemplary embodiment in the present disclosure, the surface area of the electrode layer and the dielectric layer may be increased to realize the capacitor component having the increased electric capacity. In addition, the capacitor component may be efficiently manufactured by minimizing the number of semiconductor processes.

While exemplary embodiments have been shown and described above, it will be apparent to those skilled in the art that modifications and variations could be made without departing from the scope of the present invention as defined by the appended claims.

What is claimed is:

1. A capacitor component, comprising:
 a porous body;
 a first electrode layer covering surfaces of pores of the porous body;
 a dielectric layer covering the first electrode layer;
 a second electrode layer filling the pores of the porous body and covering the dielectric layer;
 a common electrode layer connected to the first electrode layer; and
 insulating layers spaced apart from each other, and respectively disposed in the pores of the porous body and between the common electrode layer and the second electrode layer.

2. The capacitor component of claim 1, wherein the pores of the porous body penetrate through the porous body.

3. The capacitor component of claim 2, wherein the pores of the porous body have a cylindrical shape.

4. The capacitor component of claim 2, wherein the pores of the porous body are arranged in an array.

5. The capacitor component of claim 1, wherein the common electrode layer is connected to an exposed region of the first electrode layer exposed by the dielectric layer.

6. The capacitor component of claim 1, wherein the first electrode layer covers the entire surface of the pores of the porous body.

7. The capacitor component of claim 1, wherein the second electrode layer includes a conductive polymer.

8. The capacitor component of claim 1, wherein the second electrode layer is a plating layer.

9. The capacitor component of claim 1, wherein each of the insulating layers is in contact with the second electrode layer.

10. The capacitor component of claim 1, wherein the first electrode layer comprises a plurality of holes in which the insulating layers are disposed, respectively.

11. A capacitor component, comprising:
 a porous body;
 a first electrode layer covering surfaces of pores of the porous body;
 a dielectric layer covering the first electrode layer;
 a second electrode layer filling the pores of the porous body and covering the dielectric layer;
 a metal layer connected to an exposed region of the porous body exposed by the first electrode layer; and
 a plurality of stack units stacking on each other, each stack unit including the porous body, the first electrode layer, the dielectric layer, the second electrode layer, and the metal layer.

12. The capacitor component of claim 11, wherein the metal layer is in contact with one surface of upper and lower surfaces of the porous body and a side surface thereof.

13. The capacitor component of claim 11, wherein the porous body is an anodic oxidant which is a material forming the metal layer.

14. The capacitor component of claim 11, wherein the first electrode layer and the dielectric layer extend to a region between the metal layer and the second electrode layer.

15. The capacitor component of claim 14, wherein unevenness is disposed in a region corresponding to the region, in which the first electrode layer and the dielectric layer extend, in the metal layer, and the first electrode layer and the dielectric layer are disposed along the unevenness of the metal layer.

16. The capacitor component of claim 11, wherein each stack unit further includes an insulating layer covering one side surface of the metal layer.

17. The capacitor component of claim 16, wherein the insulating layer of one of the plurality of stack units is disposed at a position opposite to an insulating layer of another stack unit adjacent to the one stack unit.

18. The capacitor component of claim 11, further comprising:
 first and second external electrodes covering side surfaces of the plurality of stack units.

19. A capacitor component, comprising:
 a body having a plurality of pores, a thickness of an upper portion of a wall of the body between two adjacent pores among the plurality of pores being less than a thickness of a lower portion of the wall of the body between the two adjacent pores;

a first electrode layer covering surfaces of the body;
a dielectric layer covering the first electrode layer; and
a second electrode layer filling the plurality of pores in the body,
wherein the dielectric layer is disposed between the first electrode layer and the second electrode layer to isolate the first electrode layer and the second electrode layer from each other, and
the first electrode completely surrounds the body.

20. The capacitor component of claim 19, wherein the wall of the body includes a metal oxide layer.

21. The capacitor component of claim 20, wherein the body further includes a base supporting the wall, and
the base of the body is made of the metal.

22. The capacitor component of claim 21, wherein the base is in contact with the first electrode layer.

23. The capacitor component of claim 19, wherein the second electrode layer includes a conductive polymer.

* * * * *